(12) United States Patent
Kim et al.

(10) Patent No.: US 9,881,940 B2
(45) Date of Patent: Jan. 30, 2018

(54) ARRAY SUBSTRATE AND DISPLAY DEVICE

(71) Applicant: BOE TECHNOLOGY GROUP CO., LTD., Beijing (CN)

(72) Inventors: Heecheol Kim, Beijing (CN); Youngsuk Song, Beijing (CN); Seongyeol Yoo, Beijing (CN); Seungjin Choi, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 14/421,315

(22) PCT Filed: Jul. 3, 2014

(86) PCT No.: PCT/CN2014/081568
§ 371 (c)(1),
(2) Date: Feb. 12, 2015

(87) PCT Pub. No.: WO2015/100998
PCT Pub. Date: Jul. 9, 2015

(65) Prior Publication Data
US 2016/0035744 A1 Feb. 4, 2016

(30) Foreign Application Priority Data

Dec. 31, 2013 (CN) .......................... 2013 1 0752787

(51) Int. Cl.
*H01L 27/12* (2006.01)
*G02F 1/1345* (2006.01)
*G02F 1/1362* (2006.01)

(52) U.S. Cl.
CPC .......... *H01L 27/124* (2013.01); *G02F 1/1345* (2013.01); *G02F 1/1362* (2013.01); *G02F 2001/136254* (2013.01)

(58) Field of Classification Search
CPC ....... G02F 1/1333; G02F 1/1345; H01L 33/00
(Continued)

(56) References Cited

U.S. PATENT DOCUMENTS 6,111,621 A * 8/2000 Kim ...................... G02F 1/1309
349/192
2004/0125307 A1 7/2004 Lee et al.
(Continued)

FOREIGN PATENT DOCUMENTS

CN 1514275 A 7/2004
CN 101999095 A 3/2011
(Continued)

OTHER PUBLICATIONS

International Search Report dated May 9, 2014; PCT/CN2014/081568.
(Continued)

*Primary Examiner* — Cuong Q Nguyen
*Assistant Examiner* — Tong-Ho Kim
(74) *Attorney, Agent, or Firm* — Ladas & Parry LLP

(57) ABSTRACT

An array substrate and a display device, the array substrate comprises a fan-out area, an edge area and a display area for performing display, the fan-out area and the edge area are connected with the display area and located on two non-adjacent sides of the display area respectively; a plurality of wirings are arranged on the array substrate, and the wirings are routed through the display area and extend into the edge area, the input end of each wiring is located in the fan-out area; pads are configured for the wirings respectively are located on the side far away from the input end of each wiring, and the pads are located in the edge area.

15 Claims, 2 Drawing Sheets

(58) Field of Classification Search
USPC .................................................... 257/72, 59
See application file for complete search history.

(56) References Cited

U.S. PATENT DOCUMENTS

| | | |
|---|---|---|
| 2005/0146349 A1 | 7/2005 | Lai et al. |
| 2009/0294771 A1* | 12/2009 | Kim .................. G02F 1/136204 257/59 |
| 2011/0018142 A1 | 1/2011 | Kawamura et al. |

FOREIGN PATENT DOCUMENTS

| | | | |
|---|---|---|---|
| CN | 103713410 A | | 4/2014 |
| TW | 200523563 A | | 7/2005 |
| TW | 201024874 A | * | 7/2010 |
| TW | 201024874 A | | 7/2010 |

OTHER PUBLICATIONS

Written Opinion of the International Searching Authority dated Sep. 22, 2014; PCT/CN2014/081568.
First Chinese Office Action dated Oct. 9, 2015; Appln. No. 201310752787.2.
Second Chinese Office Action Appln. No. 201310752787.2; dated Mar. 4, 2016.

* cited by examiner

ARRAY SUBSTRATE AND DISPLAY DEVICE

TECHNICAL FIELD

The embodiments of present disclosure relate to an array substrate and a display device.

BACKGROUND

With regard to a display device having a liquid crystal display panel, an organic light-emitting display panel or the like, the subsequent operations such as bonding of a driver IC and assembling can be performed after the display panel is inspect/tested.

An inspection method of a display panel is shown in FIG. 1, the array substrate is provided with a display area 92 for performing display, a large number of wirings (data lines or gate lines) are arranged in the display area 92, and a fan-out area 91 is disposed on one side of the display area 92. The wirings enter the display area 92 after fanning out in the fan-out area 91, and a short-circuiting bar connected with a plurality of wirings is disposed in the cutting area 931 outside the fan-out area 91. In this way, the signal can be input to the plurality of wirings 1 via the short-circuiting bar 8, and whether a wiring suffers a problem or not can be detected according to the display status. After the inspection/detection is completed, the cutting area 931 and the short-circuiting bar 8 thereof are cut away, the rest of the input ends 11 of the wirings in the fan-out area 91 are used for connection with the driver IC.

SUMMARY

The embodiments of present disclosure provide an array substrate and a display device, and in the array substrate and the display device each wiring cam be inspected independently and a defect can be positioned accurately.

At least one embodiment of present disclosure provides an array substrate, which comprises a fan-out area, an edge area and a display area for performing display, the fan-out area and the edge area are connected with the display area and located on two non-adjacent sides of the display area respectively; a plurality of wirings are arranged on the array substrate, and the wirings are routed through the display area and extend into the edge area, and the input end of each wiring is located in the fan-out area; pads configured for the wirings respectively are located on the side far away from the input end of each wiring, and the pads are located in the edge area.

At least one embodiment of present disclosure provides a display device comprising the above-mentioned array substrate.

BRIEF DESCRIPTION OF THE DRAWINGS

In order to clearly illustrate the technical solution of the embodiments of the disclosure, the drawings of the embodiments will be briefly described in the following; it is obvious that the described drawings are only related to some embodiments of the disclosure and thus are not limitative of the disclosure.

REFERENCE NUMERALS

1: wiring; 11: input end of wiring; 2: pad; 3: switch unit; 31: control line; 311: control signal pad; 8: short-circuiting bar; 91: fan-out area; 92: display area; 93: edge area; 931: cutting area.

DETAILED DESCRIPTION

In order to make objects, technical details and advantages of the embodiments of the disclosure apparent, the technical solutions of the embodiments will be described in a clearly and fully understandable way in connection with the drawings related to the embodiments of the disclosure. Apparently, the described embodiments are just a part but not all of the embodiments of the disclosure. Based on the described embodiments herein, those skilled in the art can obtain other embodiment(s), without any inventive work, which should be within the scope of the disclosure.

Figure 1:
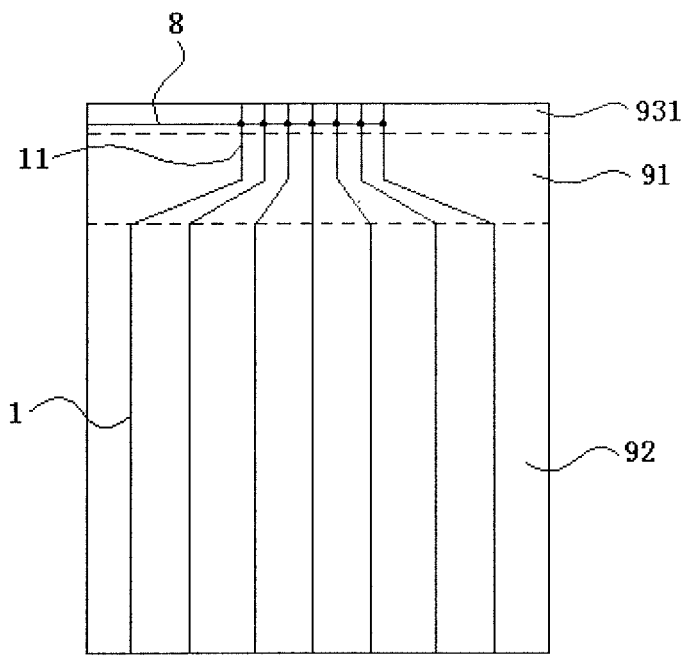
FIG. 1 is a top view showing a structure of an array substrate.

Although the inspection method using the short-circuiting bar on the array substrate as shown in FIG. 1 is convenient, the detection signals are simultaneously input into a plurality of the data lines, and therefore, it is unable to detect each wiring independently and the position of a defect cannot be determined accurately.

Figure 2:
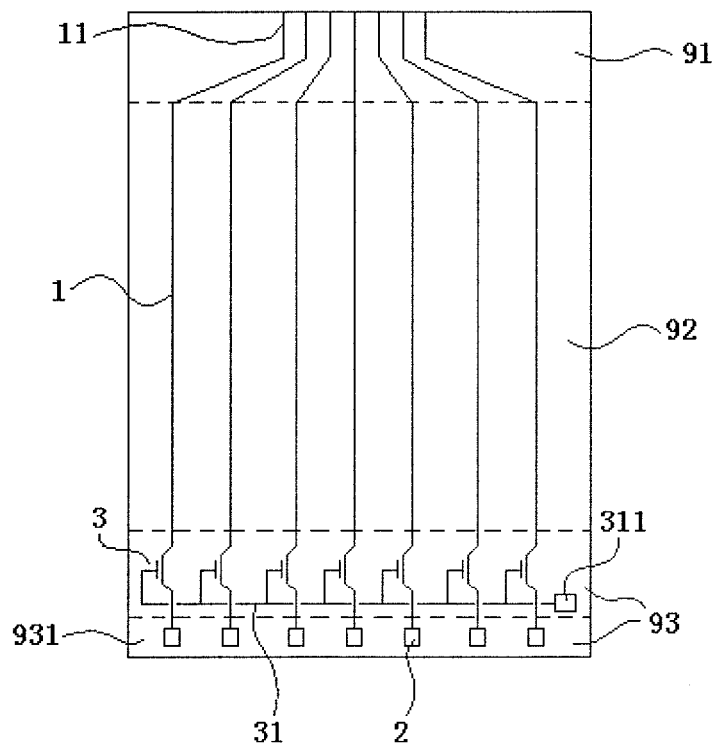
FIG. 2 is a top view showing a structure of an array substrate according to an embodiment of present disclosure.
Figure 3:
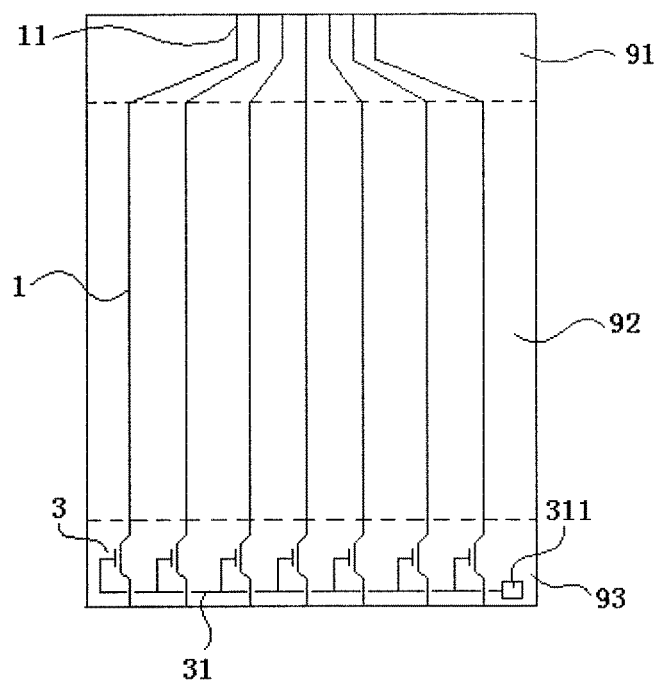
FIG. 3 is a top view showing a structure of an array substrate after the cutting area is cut away according to an embodiment of present disclosure.
Figure 4:
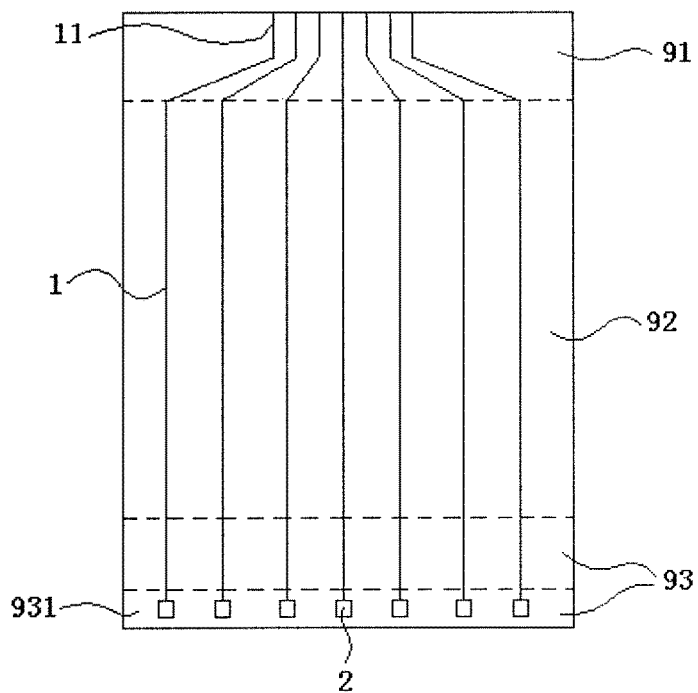
FIG. 4 is a top view showing a structure of another array substrate according to an embodiment of present disclosure.

As shown in FIG. 2 to FIG. 4, at least one embodiment of present disclosure provides an array substrate.

For example, the array substrate can be of different types such as an array substrate of a liquid crystal display panel or an array substrate of an organic light-emitting display panel or the like. According to the different types, the array substrate can be accordingly provided with different structures such as thin film transistors, pixel electrodes, and common electrode lines or the like or structures such as negative electrode, positive electrode, organic light-emitting layer or the like, the description is not repeated here.

The array substrate can comprise a fan-out area 91, a display area 92 and an edge area 93. A plurality of wirings 1 are arranged on the array substrate, one end of each wiring 1 is an input end 11 for connecting with a drive IC; on the side far away from the input end of each wiring, there is provided a pad 2 for connecting with a detection pin.

The display area 92 is used for performing display, the wirings 1 are routed through the display area 92, and the wirings 1 extend parallel to each other, for example, the wirings 1 are signal lines such as gate lines, data lines or the like. The display area 92 is also provided with other structures such as thin film transistor array, pixel units (for example, pixel units each can comprise a pixel electrode, an organic light-emitting diode) or the like, and the description is not repeated here.

The fan-out area 91 is located outside one side of the display area 92, and as shown in FIG. 2 to FIG. 4, the input end 11 of each wiring 1 is located in the fan-out area 91. Because the pitch (interval) between two adjacent wirings 1 is equal to the width or length of a pixel unit, the pitch is relatively larger, and the pitch of the drive IC port is small, and therefore, the wirings 1 need to be firstly "crowded" in the fan-out area 91, then the input ends 11 of the wirings are connected with the drive IC port.

The edge area 93 is located outside one side of the display area 92 far away from the fan-out area 91, the wirings 1 extend into the edge area 93, and the pads 2 are located in the edge area 93.

As above-mentioned, in the fan-out area 91, the pitch between two adjacent wirings is shorter, so it is unable to provide a pad 2 for each wiring 1, only the inspection structure comprising a short-circuiting bar can be adopted, each wiring is electrically connected to other wirings in this inspection structure comprising a short-circuiting bar, so the signals in all wirings inevitably become the same. Therefore, it is unable to detect each wiring independently and the defect cannot be positioned accurately. The array substrate in an embodiment of present disclosure, as shown in FIG. 2, a pad 2 configured for each wiring is located on the side far away from the input end of each wiring (that is, in the edge area 93). In the edge area 93, the pitch between two adjacent wirings is relatively larger, so there is enough space to provide the pad 2 for each wiring. Therefore, different data can be independently input to different wirings using the detection pin(s) via the pads 2. It can be realized that each wiring is detected independently, and the detection accuracy is improved.

In an embodiment of present disclosure, for example, as shown in FIG. 2 or FIG. 3, switch units 3 capable of turning-on and turning-off can be disposed on the wirings 1 in the edge area 93, and the pads 2 are farther away from the input ends of the wirings than the switch units 3.

The array substrate as shown in FIG. 1, the wirings 1 extend straightly to the edge of the array substrate, so the ends far away from the input ends 11 are exposed outwards, the entire wiring is charged in the display process. In the application of the voltage, the exposed end of each wiring will be rapidly corroded. The normal display will be affected when the corrosion extends to the display area 92. The array substrate in embodiments of present disclosure, switch units 3 are disposed in the edge area 93, when the detection is being performed, the switch units 3 are turned on, and therefore the switch units 3 have no influence to the detection. After the detection is completed, the switch units 3 are turned off, and the cutting area 931 is cut away. In this way, as shown in FIG. 3, when the normal display is performed, the exposed end of each wiring 1 is not charged (because the applied voltage is blocked by the switch units 3), so the corrosion rate of the wirings is remarkably reduced. Furthermore, even the wirings 1 are corroded, the corrosion will be blocked when the corrosion extends to the switch units 3, because the turned-off switch units 3 each inevitably comprise a disconnection part. Therefore, the corrosion of the wirings 1 cannot be extended into the display area 92, the normal display cannot be affected.

For example, a portion of the edge area 93 far away from the display area 92 is a cutting area 931, the cutting area 931 is configured to be cut away after the inspection is completed, and the above-mentioned pads 2 are disposed in the cutting area 931, so the pads 2 will be removed when the cutting area 931 is cut away; the switch units 3 are located in the edge area 93 between the cutting area 931 and the display area 92, so the switch units 3 are retained after the cutting area 931 is cut away.

Apparently, the width of the pad 2 is greater than that of other portions of a wiring 1, so some properties (such as electrical properties, anti-corrosion performance or the like) can be influenced to the wirings by the existence of the pads 2. When the pads 2 are located in the cutting area 931, the pads 2 can be cut away after the inspection is completed, so as to avoid the normal display from being influenced.

For example, the above-mentioned switch units 3 are thin film transistors, the first electrode and the second electrode of each thin film transistor are connected with a same wiring 1, and the gate electrode of each thin film transistor is connected with a control line configured to transmit the control signal.

That is to say, a thin film transistor can be used as a switch unit 3, that is, a thin film transistor is added in series to a wiring 1; the first electrode and the second electrode (that is source electrode and drain electrode) are connected with a same wiring 1, and the gate electrode is connected with a control line 31 configured to transmit the control signal, so the thin film transistor can be controlled to turn on/off under the control of the control line 31. The thin film transistors are the most widely used switch units 3 on the array substrate, the technology is mature, the structure is simple and easy to control, the reliability is high, and the cost is low, they can be produced along with the thin film transistors in the display area 92, and therefore, the thin film transistors can be used as switch units 3.

It should be noted that it is possible to elect other structures only if they can function as a switch as the switch units 3.

For example, the control line 31 is located in the edge area 93.

Obviously, the display area 92 can be provided with other structures for performing display such as other wirings 1, the thin film transistor array for driving, pixel electrodes (or positive electrodes) or the like. Therefore, it is difficult to dispose the control line 31 in the display area 92. Meanwhile, the above-mentioned thin film transistors (equivalent to switch units 3) are arranged in the edge area 93, so it is convenient to control the thin film transistor if the control line 31 is located in the edge area 93.

For example, as shown in FIG. 2 and FIG. 3, a control signal pad 311 configured to introduce the control signal can be disposed on the control line 31.

That is to say, a control signal pad 311 can be disposed on the control line 31, and the control signal pad 311 can be touched by the control pin when the inspection is performed, the control signal is input to turn on the thin film transistors.

For example, in at least one embodiment of present disclosure, the control line 31 can be connected with a control signal port configured to output the control signal.

That is to say, a control signal port capable of generate control signal can be disposed on the array substrate. The control line 31 is connected with the control signal port.

For example, for convenience, the control signal pad 311 or the control signal port can be disposed in the edge area 93.

For example, a portion of the edge area 93 far away from the display area 92 is a cutting area 931, the cutting area 931 is configured to be cut away after the inspection is completed, and the pads 2 are located in the cutting area 931.

The array substrate in at least one embodiment of present disclosure, each wiring (data line, gate line or the like) is provided with a pad, so different pads can be contacted/touched by the detection pin respectively, different signals can be input to different wirings. That is, the signals in the wirings are independent of one another, and therefore, the independently detection can be performed with respect to each wiring, and the defect can be positioned accurately.

Because the arrangement of the wirings is dense in the fan-out area, the pitch between two adjacent wirings is short, so there is no space to provide the pads. Therefore, in the array substrate in at least one embodiment of present disclosure, the pads are located on one side far away from the input end of each wiring, where the pitch is larger, so it is easier to provide the pads.

It should be understood that, in an embodiment of present disclosure, the above-mentioned switch units 3, cutting area 931 or the like may be not necessary. For example, as shown in FIG. 4, there are no switch units 3, the pads 2 are directly located in the cutting area 931; or there are switch units 3 but no cutting area 931 is provided, switch units 3 and the pads 2 are all retained on the array substrate after the inspection; or there are no switch units 3 and no cutting area 931, that is, the pads 2 are retained on the detection completed array substrate after the inspection.

For example, the wirings 1 comprise gate lines and/or data lines, that is, the present embodiment is applicable to gate lines and/or data lines. If the array substrate comprises other to-be-detect wirings 1, the structure of present embodiment can also be used.

It should be understood that, in the embodiments and its corresponding drawings of the present disclosure, one kind of wirings (such as data lines) is described as an example, when the wirings comprise more than one kind (such as data lines and gate lines), each kind of wirings can be provided with the input ends 11 respectively, then the fan-out area 91, the edge area 93 or the like for each kind of wirings respectively can be located on the different corresponding positions. For example, data lines extend in a vertical direction, and gate lines extend in a horizontal direction, so the data lines and the gate lines cross each other. Accordingly, the fan-out area and the edge area corresponding to the data lines are located on the upper and lower sides of the array substrate, while the fan-out area and the edge area corresponding to the gate lines are located on the left and right sides of the array substrate.

At least one embodiment of present disclosure provides a display device comprising any one of the above-mentioned array substrate.

The display device can comprise any products or components having display function as follows: liquid crystal panel, e-Paper, OLED panel, mobile phone, panel computer. TV set, display apparatus, laptop, digital photo frame, navigation or the like.

The display device in the embodiment of present disclosure comprises the above-mentioned array substrate, and therefore each wiring can be inspected independently and the defect can be positioned accurately.

What are described above is related to the illustrative embodiments of the disclosure only and not (imitative to the scope of the disclosure; the scopes of the disclosure are defined by the accompanying claims.

The application claims priority under 35 U.S.C. 119 to Chinese Patent Application No. 201310752787.2, filed on Dec. 31, 2013, which is hereby incorporated by reference in its entirety.

The invention claimed is:

1. An array substrate, comprising:
   a fan-out area, an edge area and a display area for performing display, wherein the fan-out area and the edge area are connected with the display area and located on two non-adjacent sides of the display area respectively;
   a plurality of wirings arranged on the array substrate, wherein the wirings are routed through the display area and extends into the edge area, and an input end of each wiring is located in the fan-out area; and
   pads configured for the wirings respectively, wherein each pad is located on a side far away from the input end of each wiring, and the pads are located in the edge area, wherein the pads are configured to correspond to the wirings on one-to-one basis, and the pads are configured to receive different signals and to apply the different signals to the wirings respectively to inspect the wirings on one-to-one basis,
   wherein each wiring and its corresponding pad on one-to-one basis form a signal path that is disconnected and independent from other signal paths formed by other wirings and their corresponding pads,
   wherein the pads are disconnected with each other and independent from each other and are arranged along a straight line,
   wherein a portion of the edge area far away from the display area is a cutting area, and the cutting area is configured to be cut away from the array substrate along a cutting line after an inspection is completed, and
   wherein each pad is completely disposed in the cutting area and is configured to be completely removed from the array substrate after the inspection is completed.

2. The array substrate according to claim 1, further comprising switch units, wherein the switch units are disposed on the wirings in the edge area, and the pads are farther away from the input ends of the wirings.

3. The array substrate according to claim 2, wherein a portion of the edge area far away from the display area is a cutting area, and the cutting area is configured to be cut away after an inspection is completed;
   the pads are disposed in the cutting area, and the switch units are located in the edge area between the cutting area and the display area.

4. The array substrate according to claim 3, wherein the switch units are thin film transistors, the first electrode and the second electrode of each thin film transistor are connected with a same wiring, and the gate electrode of each thin film transistor is connected with a control line configured to transmit a control signal.

5. The array substrate according to claim 4, wherein the control line is located in the edge area.

6. The array substrate according to claim 4, wherein the control line is connected with a control signal port configured to output the control signal; or
   a control signal pad configured to introduce the control signal is disposed on the control line.

7. The array substrate according to claim 6, wherein the control signal pad or the control signal port is disposed in the edge area.

8. The array substrate according to claim 2, wherein the switch units are thin film transistors, the first electrode and the second electrode of each thin film transistor are connected with a same wiring, and the gate electrode of each thin film transistor is connected with a control line configured to transmit a control signal.

9. The array substrate according to claim 8, wherein the control line is located in the edge area.

10. The array substrate according to claim 8, wherein the control line is connected with a control signal port configured to output the control signal; or
    a control signal pad configured to introduce the control signal is disposed on the control line.

11. The array substrate according to claim 10, wherein the control signal pad or the control signal port is disposed in the edge area.

12. The array substrate according to claim 1, wherein a portion of the edge area far away from the display area is a cutting area, the cutting area is configured to be cut away after the detection is completed, the pads are located in the cutting area.

13. The array substrate according to claim 1, wherein the wirings comprise gate lines and/or data lines.

14. A display device comprising the array substrate according to claim 1.

15. The array substrate according to claim 1, further comprising switch units, wherein the switch units are disposed on the wirings in the edge area, and the cutting line is located between the switch units and the pads.

* * * * *